(12) United States Patent
Tseng et al.

(10) Patent No.: US 10,043,972 B2
(45) Date of Patent: Aug. 7, 2018

(54) CONDUCTIVE-BRIDGING RANDOM ACCESS MEMORY

(71) Applicant: Winbond Electronics Corp., Taichung (TW)

(72) Inventors: Tseung-Yuen Tseng, Hsinchu (TW); Tsung-Ling Tsai, Kaohsiung (TW); Fa-Shen Jiang, Taoyuan (TW)

(73) Assignee: Winbond Electronics Corp., Taichung (TW)

( * ) Notice: Subject to any disclaimer, the term of this patent is extended or adjusted under 35 U.S.C. 154(b) by 88 days.

(21) Appl. No.: 15/084,149

(22) Filed: Mar. 29, 2016

(65) Prior Publication Data

US 2017/0133584 A1 May 11, 2017

(30) Foreign Application Priority Data

Nov. 5, 2015 (TW) .............................. 104136448 A

(51) Int. Cl.
*H01L 45/00* (2006.01)

(52) U.S. Cl.
CPC .......... *H01L 45/085* (2013.01); *H01L 45/128* (2013.01); *H01L 45/1233* (2013.01); *H01L 45/1253* (2013.01); *H01L 45/1266* (2013.01); *H01L 45/146* (2013.01); *H01L 45/1625* (2013.01)

(58) Field of Classification Search
CPC ..... H01L 45/06; H01L 45/065; H01L 45/085; H01L 45/128; H01L 45/1293; H01L 45/1266; H01L 45/1253; H01L 45/1233; H01L 45/146
See application file for complete search history.

(56) References Cited

U.S. PATENT DOCUMENTS

| | | | | |
|---|---|---|---|---|
| 6,425,752 | B1 * | 7/2002 | Check ................ | B29C 33/3828 249/79 |
| 9,246,087 | B1 * | 1/2016 | Wang .................... | H01L 45/12 |
| 9,252,359 | B2 * | 2/2016 | Jameson, III ....... | H01L 45/1253 |
| 2003/0194865 | A1 * | 10/2003 | Gilton ................. | G11C 13/0011 438/689 |

(Continued)

FOREIGN PATENT DOCUMENTS

| CN | 1953228 | 4/2007 |
|---|---|---|
| CN | 1953228 A | 4/2007 |

(Continued)

OTHER PUBLICATIONS

Stanford Materials, "Tungsten Products," http://www.stanfordmaterials.com/Tungsten-carbide-copper.html, Jan. 27, 2013.*

*Primary Examiner* — Joseph C Nicely
(74) *Attorney, Agent, or Firm* — Muncy, Geissler, Olds & Lowe, P.C.

(57) ABSTRACT

A conductive-bridging random access memory is provided. The conductive-bridging random access memory includes a bottom electrode layer on a semiconductor substrate, an electrical resistance switching layer on the bottom electrode layer, a barrier layer on the electrical resistance switching layer, a top electrode layer on the barrier layer, and a high thermal-conductive material layer between the bottom electrode layer and the barrier layer. The high thermal-conductive material layer has a thermal conductivity in a range of 70-5000 W/mK.

9 Claims, 9 Drawing Sheets

(56) References Cited

U.S. PATENT DOCUMENTS

| | | | |
|---|---|---|---|
| 2007/0108431 A1* | 5/2007 | Chen | H01L 27/2436 257/4 |
| 2008/0128677 A1* | 6/2008 | Park | G11C 11/5678 257/4 |
| 2009/0101883 A1* | 4/2009 | Lai | H01L 45/06 257/3 |
| 2009/0189142 A1* | 7/2009 | Chen | H01L 45/06 257/4 |
| 2009/0194758 A1* | 8/2009 | Chen | G11C 11/5678 257/4 |
| 2009/0236581 A1* | 9/2009 | Yoshida | H01L 27/101 257/2 |
| 2009/0302300 A1* | 12/2009 | Chang | H01L 27/2409 257/4 |
| 2010/0006813 A1* | 1/2010 | Xi | H01L 27/2463 257/4 |
| 2010/0110765 A1* | 5/2010 | Tian | G11C 13/0004 365/148 |
| 2010/0207168 A1* | 8/2010 | Sills | H01L 27/2463 257/202 |
| 2011/0031461 A1* | 2/2011 | Kang | G11C 11/5678 257/3 |
| 2011/0193049 A1* | 8/2011 | Iwakaji | H01L 27/1021 257/4 |
| 2011/0312178 A1* | 12/2011 | Watanabe | C23C 14/0094 438/656 |
| 2012/0241705 A1* | 9/2012 | Bresolin | H01L 45/06 257/2 |
| 2013/0122359 A1* | 5/2013 | Sato | H01M 4/13 429/188 |
| 2013/0320290 A1* | 12/2013 | Park | H01L 45/1286 257/4 |
| 2014/0117302 A1* | 5/2014 | Goswami | H01L 45/06 257/4 |
| 2014/0131653 A1 | 5/2014 | Lee et al. | |
| 2014/0239245 A1* | 8/2014 | Lengade | H01L 45/12 257/4 |
| 2015/0069318 A1* | 3/2015 | Arayashiki | H01L 45/085 257/4 |
| 2015/0168087 A1* | 6/2015 | Kim | F28F 21/08 361/720 |
| 2015/0188039 A1* | 7/2015 | Wang | H01L 45/12 257/4 |
| 2015/0263069 A1* | 9/2015 | Jo | H01L 45/085 365/148 |
| 2016/0006088 A1* | 1/2016 | Boetcher | H01M 10/63 165/80.2 |
| 2016/0204344 A1* | 7/2016 | Hsieh | H01L 45/146 257/4 |
| 2016/0336510 A1* | 11/2016 | Park | H01L 45/085 |
| 2017/0358628 A1* | 12/2017 | Fantini | H01L 27/2463 |
| 2017/0365642 A1* | 12/2017 | Ravasio | H01L 27/2427 |
| 2017/0371218 A1* | 12/2017 | Kailasam | G02F 1/153 |

FOREIGN PATENT DOCUMENTS

| | | |
|---|---|---|
| TW | 201427125 | 4/2007 |
| TW | 200843039 | 11/2008 |
| TW | 200843039 A | 11/2008 |
| TW | 201427125 A | 7/2014 |
| TW | 201507225 (A) | 2/2015 |

* cited by examiner

CONDUCTIVE-BRIDGING RANDOM ACCESS MEMORY

CROSS REFERENCE TO RELATED APPLICATIONS

This Application claims priority of Taiwan Patent Application No. 104136448, filed on Nov. 5, 2015 and entitled "CONDUCTIVE-BRIDGING RANDOM ACCESS MEMORY", the entirety of which is incorporated by reference herein.

BACKGROUND

Field of the Disclosure

The present disclosure relates to a memory device, and in particular it relates to a conductive-bridging random access memory.

Description of the Related Art

Among resistive random access memories, there is a type of memory called a conductive-bridging random access memory (CBRAM). The electrical resistance state switching mechanism of conductive-bridging random access memory is a redox reaction by applying a voltage, and metal ions are driven to move. When the metal ions move into the dielectric layer and connect with the underlying metal layer, conductive paths, such as metal bridges or metal filaments, are formed. As a result, the electrical resistance is reduced. Subsequently, the metal ions may be driven to leave the dielectric layer by applying a reverse voltage. As a result, the conductive paths, such as metal bridges or metal filaments, are fractured, and the electrical resistance is increased. In other words, the conductive-bridging random access memory can achieve a memory-storage function by the electrical resistance state switching mechanism mentioned above. In such a conductive-bridging random access memory, copper (Cu), silver (Ag) or an alloy thereof may be used as the main source of metal ions.

Among the resistive random access memories, there is another type of memory called an oxygen-anion-migration-based resistive random access memory. The resistance value of the oxygen-anion-migration-based resistive random access memory may be switched by the migration of the oxygen anion or equivalent positive-charged oxygen vacancies. Specifically, in the oxygen-anion-migration-based resistive random access memory, an interface layer may be formed between the upper electrode layer and the oxide layer by using titanium metal as the upper electrode layer. As a result, the electrical resistance state switching region (i.e., the region in which the oxygen vacancy filaments are formed or fractured) can be effectively controlled within the interface layer, thereby improving the electrical resistance state switching effect.

However, in the conductive-bridging random access memory, the upper electrode layer is made of copper, silver or alloys thereof, and therefore the effective interface layer similar to that in the oxygen-anion-migration-based resistive random access memory cannot be formed. In addition, when the conductive-bridging random access memory is switched from the low-electrical-resistance state to the high-electrical-resistance state, the metal filament conductive paths of copper or silver are fractured and all metal ions go back to the upper electrode layer. Subsequently, when the conductive-bridging random access memory is switched from the high-electrical-resistance state to the low-electrical-resistance state, the metal filament conductive paths are randomly formed within the dielectric layer. In other words, the electrical resistance state switching region (i.e., the region in which the metal filaments are formed or fractured) cannot be effectively controlled within a specific region.

Due to the variability of the electrical resistance state switching region mentioned above, both the performance stability and the product lifetime of the conductive-bridging random access memory are significantly reduced. Therefore, an improved conductive-bridging random access memory is desirable.

BRIEF SUMMARY

The disclosure provides a conductive-bridging random access memory. The conductive-bridging random access memory includes a bottom electrode layer on a semiconductor substrate, an electrical resistance switching layer on the bottom electrode layer, a barrier layer on the electrical resistance switching layer, a top electrode layer on the barrier layer, and a high thermal-conductive material layer between the bottom electrode layer and the barrier layer. The high thermal-conductive material layer has a thermal conductivity in a range of 70-5000 W/mK.

A detailed description is given in the following embodiments with reference to the accompanying drawings.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION

Figure 1A:
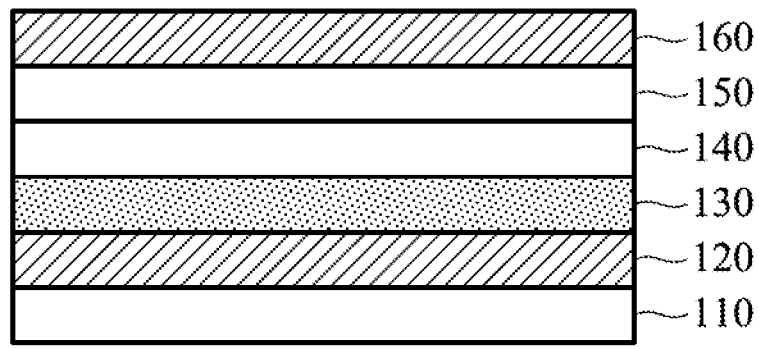
FIG. 1A shows a cross-sectional view of a conductive-bridging random access memory in accordance with some embodiments.

The present disclosure is best understood from the following detailed description when read with the accompanying figures. It should be noted that, in accordance with the standard practice in the industry, various features are not drawn to scale. In fact, the relative dimensions of the various features may be arbitrarily increased or reduced for clarity of discussion. In addition, the present disclosure may repeat reference numerals and/or letters in the various examples. This repetition is for the purpose of simplicity and clarity and does not in itself dictate a relationship between the various embodiments and/or configurations discussed.

The disclosure provides a conductive-bridging random access memory a method for fabricating the conductive-bridging random access memory. FIG. 1A shows a cross-sectional view of a conductive-bridging random access memory 100A in accordance with some embodiments.

Referring to FIG. 1, a semiconductor substrate 110 is provided. The semiconductor substrate 110 may include a bulk semiconductor substrate (such as silicon substrate), a compound semiconductor substrate (such as a group IIIA-VA semiconductor substrate), a silicon-on-insulator (SOI) substrate, or another applicable substrate. In this embodiment, the semiconductor substrate 110 is a silicon substrate. The semiconductor substrate 110 may be a doped semiconductor substrate or an undoped semiconductor substrate. In some embodiments, the semiconductor substrate 110 may further include: a gate structure including silicon and metal layer, a plug contact landing structure including polysilicon and epitaxial silicon, other applicable silicon-containing structures, or a combination thereof.

Then, a bottom electrode layer 120 is formed on the semiconductor substrate 110. The bottom electrode layer 120 and the subsequent top electrode layer 160 may be used for applying voltage to the conductive-bridging random access memory 100A which may be switched to different electrical resistance states. The bottom electrode layer 120 may include any applicable conductive material. In some embodiments, the bottom electrode layer 120 may include titanium, titanium nitride, platinum, aluminum, tungsten, iridium, iridium oxide, ruthenium, tantalum, tantalum nitride, nickel, molybdenum, zirconium, indium tin oxide, heavily doped silicon semiconductor, or a combination thereof. The bottom electrode layer 120 may be formed by suitable processes, such as sputtering process, atomic layer deposition (ALD) process, chemical vapor deposition (CVD) process, evaporation process, or a combination thereof. If the thickness of the bottom electrode layer 120 is too thin, the bottom electrode layer 120 cannot be used for applying voltage due to its poor conductivity. On the other hand, if the thickness of the bottom electrode layer 120 is too thick, it may be disadvantageous in miniaturization of the device, and the cost may be increased. In some embodiments, the thickness of the bottom electrode layer 120 is in a range of 1-5000 nm. In other embodiments, the thickness of the bottom electrode layer 120 is in a range of 1-2000 nm. In another embodiment, the thickness of the bottom electrode layer 120 is in a range of 10-500 nm.

Referring to FIG. 1A, a high thermal-conductive material layer 130 is subsequently formed on the bottom electrode layer 120. In some embodiments, the thermal conductivity of the high thermal-conductive material layer 130 is in a range of 70-5000 W/mK. In other embodiments, the thermal conductivity of the high thermal-conductive material layer 130 is in a range of 170-280 W/mK. In another embodiment, the thermal conductivity of the high thermal-conductive material layer 130 is in a range of 170-190 W/mK. The high thermal-conductive material layer 130 may include nitride, oxide, carbide, metal, alloys, or a combination thereof. In some embodiments, the high thermal-conductive material layer 130 may include aluminum nitride, beryllium oxide, gold, platinum, nickel, tungsten, iron, zinc, graphite, carbon nanotubes, or a combination thereof. The high thermal-conductive material layer 130 may be formed by suitable processes, such as sputtering process, atomic layer deposition process, chemical vapor deposition process, evaporation process, furnace deposition processes, or combinations thereof. When the subsequent conductive-bridging random access memory is switched between the high-electrical-resistance state and the low-electrical-resistance state, the electrical resistance state switching region (i.e., the region in which the metal filaments are formed or fractured) can be effectively controlled within a specific region because of the presence of the high thermal-conductive material layer 130. The details will be discussed in the following paragraphs.

Next, an electrical resistance switching layer 140 is formed on the high thermal-conductive material layer 130. When the subsequent writing voltage is applied, the metal ions from the top electrode layer 160 is driven into the electrical resistance switching layer 140 to form metal filament conductive paths. As a result, the resistance value of the electrical resistance switching layer 140 may be reduced, and the conductive-bridging random access memory is switched from the high-electrical-resistance state to the low-electrical-resistance state. On the other hand, when the erasing voltage is applied, the metal ions go back to the top electrode layer 160 from the electrical resistance switching layer 140, and the metal filament conductive paths will be fractured or disappear. As a result, the resistance value of the electrical resistance switching layer 140 will be increased, and the conductive-bridging random access memory is switched from the low-electrical-resistance state to the high-electrical-resistance state.

If the thickness of the electrical resistance switching layer 140 is too thin, it is likely to cause erroneous operation because the resistance value of the high-electrical-resistance state is too low. On the other hand, if the thickness of the electrical resistance switching layer 140 is too thick, it may be disadvantageous for the conductive-bridging random access memory to be switched from the high-electrical-resistance state to the low-electrical-resistance state. In some embodiments, the thickness of the electrical resistance switching layer 140 is in a range of 1-1000 nm. In other embodiments, the thickness of the electrical resistance switching layer 140 is in a range of 1-500 nm. In another embodiment, the thickness of the electrical resistance switching layer 140 is in a range of 5-300 nm.

The electrical resistance switching layer 140 may be made of dielectric material, such as, oxides, nitrides, sulfides, or combinations thereof. In some embodiments, the electrical resistance switching layer 140 may include: lithium oxide, sodium oxide, potassium oxide, rubidium oxide, cesium oxide, beryllium oxide, magnesium oxide, calcium oxide, strontium oxide, barium oxide, scandium oxide, yttrium oxide, titanium oxide, zirconium oxide, hafnium oxide, vanadium oxide, niobium oxide, tantalum oxide, chromium oxide, molybdenum oxide, tungsten oxide, manganese oxide, iron oxide, cobalt oxide, rhenium oxide, nickel oxide, palladium oxide, platinum oxide, copper oxide, silver oxide, gold oxide, zinc oxide, cadmium oxide, boron oxide, aluminum oxide, gallium oxide, indium oxide, thallium oxide, silicon oxide, germanium oxide, tin oxide, lead oxide, antimony oxide, bismuth oxide, tellurium oxide, lithium nitride, sodium nitride, potassium nitride, rubidium nitride, cesium nitride, beryllium nitride, magnesium nitride, calcium nitride, strontium nitride, barium nitride, scandium nitride, yttrium nitride, titanium nitride, zirconium nitride, hafnium nitride, vanadium nitride, niobium nitride, tantalum nitride, chromium nitride, molybdenum nitride, tungsten nitride, manganese nitride, iron nitride, cobalt nitride, rhenium nitride, nickel nitride, palladium nitride, platinum nitride, copper nitride, silver nitride, gold nitride, zinc nitride, cadmium nitride, boron nitride, aluminum nitride, gallium nitride, indium nitride, thallium nitride, silicon nitride, germanium nitride, tin nitride, lead nitride, antimony nitride, bismuth nitride, tellurium nitride, lithium sulfide, sodium sulfide, potassium sulfide, rubidium sulfide, cesium sulfide, beryllium sulfide, magnesium sulfide, calcium sulfide, strontium sulfide, barium sulfide, scandium sulfide, yttrium sulfide, titanium sulfide, zirconium sulfide, hafnium sulfide, vanadium sulfide, niobium sulfide, tantalum sulfide, chromium sulfide, molybdenum sulfide, tungsten sulfide, manganese sulfide, iron sulfide, cobalt sulfide, rhenium sulfide, nickel sulfide, palladium sulfide, platinum sulfide, copper sulfide, silver sulfide, gold sulfide, zinc sulfide, cadmium, boron sulfide, aluminum sulfide, gallium sulfide, indium sulfide, thallium sulfide, silicon sulfide, germanium sulfide, tin sulfide, lead sulfide, antimony sulfide, bismuth sulfide, tellurium sulfide, or combinations thereof. The electrical resistance switching layer 140 may be formed by suitable processes, such as sputtering process, atomic layer deposition process, chemical vapor deposition process, evaporation process, furnace deposition processes, or combinations thereof.

Then, a barrier layer 150 is formed on the electrical resistance switching layer 140. The barrier layer 150 may prevent excessive metal ions (derived from the top electrode layer 160) from entering the electrical resistance switching layer 140, and thus the durability of the device may be enhanced. Furthermore, the barrier layer 150 may increase the adhesion between the subsequent top electrode layer 160 and the electrical resistance switching layer 140, and thus delamination may be avoided.

If the thickness of the barrier layer 150 is too thin, it is likely to cause delamination because the adhesion between the subsequent top electrode layer 160 and the electrical resistance switching layer 140 is too low. On the other hand, if the thickness of the barrier layer 150 is too thick, the metal ions may be blocked from entering the electrical resistance switching layer 140, and thus the conductive-bridging random access memory cannot be switched from the high-electrical-resistance state to the low-electrical-resistance state. In some embodiments, the thickness of the barrier layer 150 is in a range of 0.1-50 nm. In other embodiments, the thickness of the barrier layer 150 is in a range of 1-20 nm. In another embodiment, the thickness of the barrier layer 150 is in a range of 1-10 nm.

The barrier layer 150 may include any applicable conductive material. In some embodiments, the barrier layer 150 may include titanium, titanium-tungsten alloy, titanium nitride, tungsten, ruthenium, tantalum, tantalum-tungsten alloy, tantalum nitride, or combinations thereof. The barrier layer 150 may be formed by suitable processes, such as sputtering process, atomic layer deposition process, chemical vapor deposition process, evaporation process, furnace deposition processes, or combinations thereof. In other embodiments, if the above problems (i.e., delamination and excessive metal ions entering the electrical resistance switching layer) do not exist or can be overcome, the barrier layer 150 may be omitted.

Then, a top electrode layer 160 is formed on the barrier layer 150. The top electrode layer 160 and the bottom electrode layer 120 may be used for applying voltage to the conductive-bridging random access memory 100A which may be switched to different electrical resistance states. The formation method and the thickness of the top electrode layer 160 may be the same as or similar to those of the bottom electrode layer 120 and the details will not be repeated here.

Furthermore, the top electrode layer 160 may supply the metal ions in order to form metal filament conductive paths in the electrical resistance switching layer 140. Therefore, the top electrode layer 160 may include any applicable conductive material. In some embodiments, the top electrode layer 160 may include copper, gold, silver, tellurium, copper-lithium alloy, copper-sodium alloy, copper-potassium alloy, copper-rubidium alloy, copper-cesium alloys, copper-beryllium alloy, copper-magnesium alloy, copper-calcium alloy, copper-strontium alloy, copper-barium alloy, copper-scandium alloy, copper-yttrium alloy, copper-titanium alloy, copper-zirconium alloy, copper-hafnium alloy, copper-vanadium alloy, copper-niobium alloy, copper-tantalum alloy, copper-chromium alloy, copper-molybdenum alloy, copper-tungsten alloy, copper-manganese alloy, copper-iron alloy, copper-cobalt alloys, copper-rhenium alloy, copper-nickel alloy, copper-palladium alloy, copper-zinc alloy, copper-cadmium alloy, copper-boron alloy, copper-aluminum alloy, copper-gallium alloy, copper-indium alloy, copper-thallium alloy, copper-silicon alloy, copper-germanium alloy, copper-tin alloy, copper-lead alloy, copper-antimony alloy, copper-bismuth alloy, copper-tellurium alloy, or combinations thereof.

In the prior art, when the conventional conductive-bridging random access memory is switched to the low-electrical-resistance state (LRS), the metal filament conductive paths are randomly formed within the dielectric layer; and when the conventional conductive-bridging random access memory is switched to the high-electrical-resistance state (HRS), the metal ions go back to the upper electrode layer. Because the metal filament conductive paths are randomly formed during each switching process (switched to the low-electrical-resistance state), the positions and the sizes of the metal filament conductive paths formed during each switching process are different and uncontrollable. Therefore, the variability of the operating voltage is large and the device stability is poor. Furthermore, if a thick metal filament conductive path is formed, the metal ions may not go back to the top electrode layer completely. Thus, the conductive-bridging random access memory may never be switched to the high-electrical-resistance state again. In other words, the conventional conductive-bridging random access memory may not able to be switched the electrical resistance state after many cycles of switching processes, and thus it has poor endurance.

The inventors of this disclosure discovered that an additional high thermal-conductive material layer with high thermal conductivity disposed on or under the electrical resistance switching layer may significantly reduce the value and variability of the writing voltage and erasing voltage during the switching processes, and thus the endurance of the conductive-bridging random access memory is dramatically improved. It may be deduced that when a large current passes through the electrical resistance switching layer, a specific high-temperature region is formed within the electrical resistance switching layer adjacent to the high thermal-conductive material layer, and the formation and fracture of the metal filaments can be effectively controlled within the specific high-temperature region. In other words, the formation and fracture of the metal filament conductive paths would not randomly occur within the whole electrical resistance switching layer, but confined within a specific region instead. As a result, the variability of the metal filament conductive paths is smaller at each switching process, i.e., a better stability. Therefore, the endurance of the device can be significantly improved.

Furthermore, the inventors of this disclosure discovered that the thickness and electrical conductivity of the high thermal-conductive material layer, and the difference between the high thermal-conductive material layer and the electrical resistance switching layer may affect the performance of conductive-bridging random access memory. The details will be discussed in the following paragraphs.

It may be desirable to maintain the thickness of the high thermal-conductive material layer within a specific range. If the thickness of the high thermal-conductive material layer is too thin, the specific high-temperature region may not be formed. Therefore, the stability and endurance of the device may not be improved. On the other hand, if the thickness of the high thermal-conductive material layer is too thick, the electrical conductivity of the whole device may become poor. Therefore, a higher forming voltage may be needed for the conductive-bridging random access memory being switched from the initial high-electrical-resistance state to the low-electrical-resistance state. In some embodiments, the thickness of the high thermal-conductive material layer is in a range of 1-1000 nm. In other embodiments, the thickness of the high thermal-conductive material layer is in a range of 1-100 nm. In another embodiment, the thickness of the high thermal-conductive material layer is in a range of 2-20 nm.

Furthermore, if the high thermal-conductive material layer has high electrical conductivity, the influence of the high thermal-conductive material layer on the electrical conductivity of the whole device may be reduced or eliminated. Therefore, the issue of high forming voltage may be avoided. In some embodiments, the electrical conductivity of the high thermal-conductive material layer is in a range of $9\times10^6 - 1\times10^8$ S/m. In other embodiments, the electrical conductivity of the high thermal-conductive material layer is in a range of $5\times10^{-15} - 5\times10^{-14}$ S/m.

Furthermore, if the difference between the high thermal-conductive material layer and the electrical resistance switching layer is too small, the specific high-temperature region may not be formed. Therefore, the stability and endurance of the device may not be improved. In some embodiments, thermal conductivity of the electrical resistance switching layer is lower than the thermal conductivity the high thermal-conductive material layer, and the difference between the high thermal-conductive material layer and the electrical resistance switching layer is greater than 50 W/mK. In other embodiments, thermal conductivity of the electrical resistance switching layer is lower than the thermal conductivity the high thermal-conductive material layer by 50 W/mK.

In addition, if the difference of the coefficient of linear thermal expansion (CLTE) between the high thermal-conductive material layer and the electrical resistance switching layer is too large, delamination may occur when the specific high-temperature region is formed. In some embodiments, the difference between the coefficient of linear thermal expansion of the high thermal-conductive material layer and the coefficient of linear thermal expansion of the electrical resistance switching layer is equal to or smaller than $50\times10^{-6}$ (1/K).

Figure 1B:
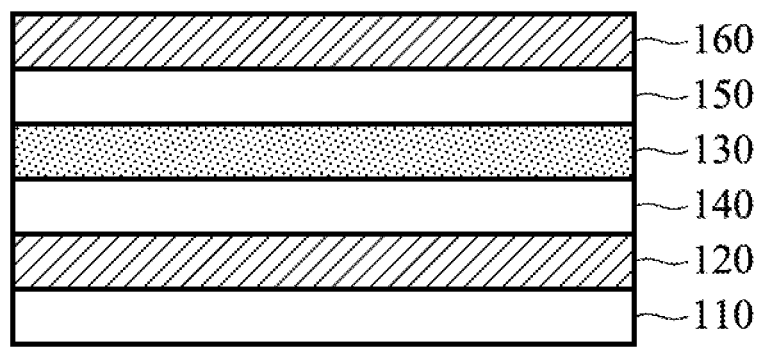
FIG. 1B shows a cross-sectional view of a conductive-bridging random access memory in accordance with alternative examples of FIG. 1A.

FIG. 1B shows a cross-sectional view of a conductive-bridging random access memory in accordance with alternative examples of FIG. 1A. The conductive-bridging random access memory 100B shown in FIG. 1B is similar to the conductive-bridging random access memory 100A shown in FIG. 1A, except that the high thermal-conductive material layer 130 is formed on the electrical resistance switching layer 140.

Figure 2:
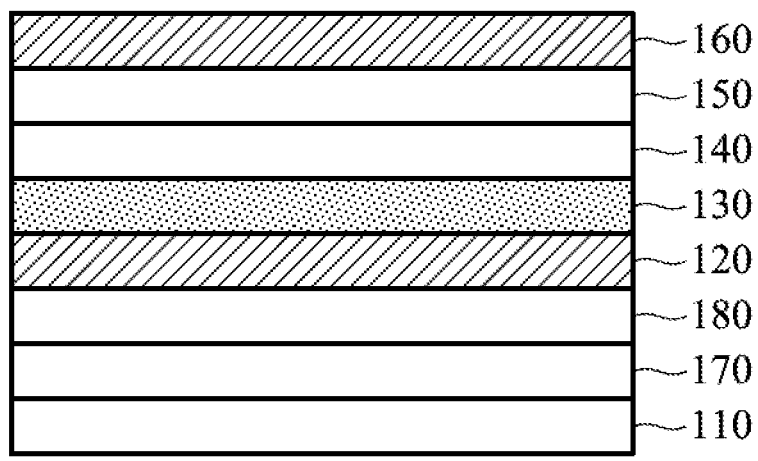
FIG. 2 shows a cross-sectional view of a conductive-bridging random access memory in accordance with other embodiments.

FIG. 2 shows a cross-sectional view of a conductive-bridging random access memory 200 in accordance with other embodiments. FIG. 2 is similar to FIG. 1A, except that an adhesion layer 170 and a conductive layer 180 are formed on the substrate layer 110 before the bottom electrode layer 120 is formed.

Referring to FIG. 2, an adhesion layer 170 is formed on the semiconductor substrate 110, and a conductive layer 180 is subsequently formed on the adhesion layer 170. The conductive layer 180 may be used as a wiring layer which allows the conductive-bridging random access memory 200 electrically connect with another conductive-bridging random access memory 200 or other device. The conductive layer 180 may be a single-layer or multi-layer conductive layer. The conductive layer 180 may include metal, alloy, metal compounds, other applicable material, or combinations thereof. In some embodiments, the conductive layer 180 is a platinum layer. In other embodiments, the conductive layer 180 is a dual-layer structure with a platinum layer formed on a titanium layer. The formation method and the thickness of the conductive layer 180 may be the same as or similar to those of the bottom electrode layer 120 and the details will not be repeated here.

The adhesion layer 170 may increase the adhesion between the conductive layer 180 and the semiconductor substrate 110, and thus delamination may be avoided. The adhesion layer 170 may include oxide, nitride, oxynitride, or combinations thereof. The formation method and the thickness of the adhesion layer 170 may be the same as or similar to those of the electrical resistance switching layer 140 and the details will not be repeated here.

Comparative Example: CBRAM without the High Thermal-Conductive Material Layer

Firstly, an RCA clean process was performed to a silicon substrate. A high temperature furnace processes was performed to grow a silicon dioxide film (thickness: 200 nm) as the adhesion layer on the silicon substrate. Then, an electron-beam evaporation process was performed to grow a titanium film (thickness: 20 nm) and a platinum layer (thickness: 30 nm) as the conductive layer. Next, an atomic layer deposition process was performed to grow a titanium nitride (TiN) film (thickness: 10 nm) as the bottom electrode layer on the platinum layer. The atomic layer deposition process was performed by using the nitrogen plasma to react with tetrakis (dimethylamino) titanium (TDMAT, Ti(N(CH$_3$)$_2$)$_4$) precursor at a temperature of 250° C. and a pressure of 0.3 Torr. Then, an AC magnetron sputtering process was performed to grow a zirconium dioxide (ZrO$_2$) film (thickness: 20 nm) as the electrical resistance switching layer on the titanium nitride film. The AC magnetron sputtering process was performed at a temperature of 200° C., a plasma power density of 1.05 W/cm$^2$, a pressure of 10 mTorr, and a gas flow rate of 18 sccm (argon:oxygen=12:6). Next, a vacuum sputtering process was performed to grow a titanium-tungsten alloy film (thickness: 2.5 nm) as the barrier layer, and a copper film (thickness: 200 nm) as the top electrode layer. Finally, a conventional lithography and etching processes were performed to define the above formed elements into a cross bar structure (size: 5 μm×5 μm), thus completing a conductive-bridging random access memory.

Example 1: CBRAM without the High Thermal-Conductive Material Layer (AlN)

In Example 1, after growing the titanium nitride film as the bottom electrode layer, an atomic layer deposition process was performed to grow an aluminum nitride (AN) film (thickness: 2 nm) as the high thermal-conductive material layer. The atomic layer deposition process was performed by using the nitrogen plasma to react with trimethylaluminum (TMA, $(CH_3)_3Al$) precursor at a temperature of 250° C. and a pressure of 0.3 Torr. Except for the step of forming the high thermal-conductive material layer, the material and steps in forming all other layers are the same as those of the Comparative Example, and the details will not be repeated here.

Example 2: CBRAM without the High Thermal-Conductive Material Layer (W)

In Example 2, after growing the titanium nitride film as the bottom electrode layer, a sputtering process was performed to grow a tungsten (W) film (thickness: 3 nm) as the high thermal-conductive material layer. The sputtering process was performed at a pressure of $7.6 \times 10^{-3}$ Torr and an argon gas flow rate of 24 sccm. Except for the step of forming the high thermal-conductive material layer, the material and steps in forming all other layers are the same as those of the Comparative Example, and the details will not be repeated here.

Figure 3A:
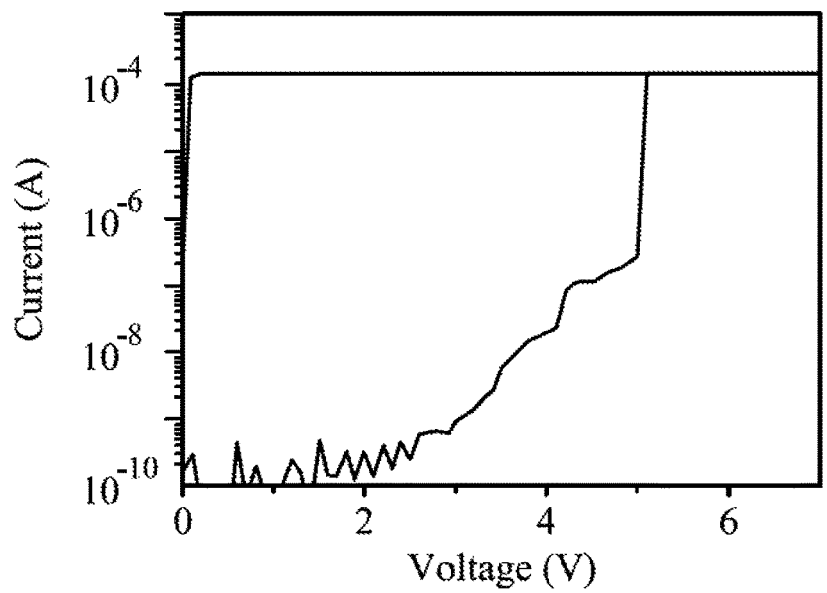
FIGS. 3A-3C show the experimental results of the forming voltages of the conductive-bridging random access memories in Comparative Example and Examples 1-2.
Figure 3B:
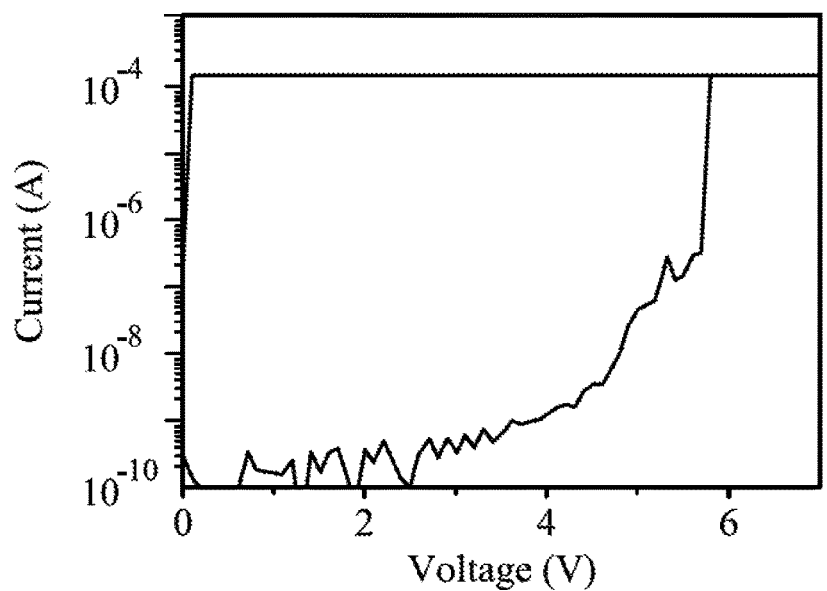
Figure 3C:
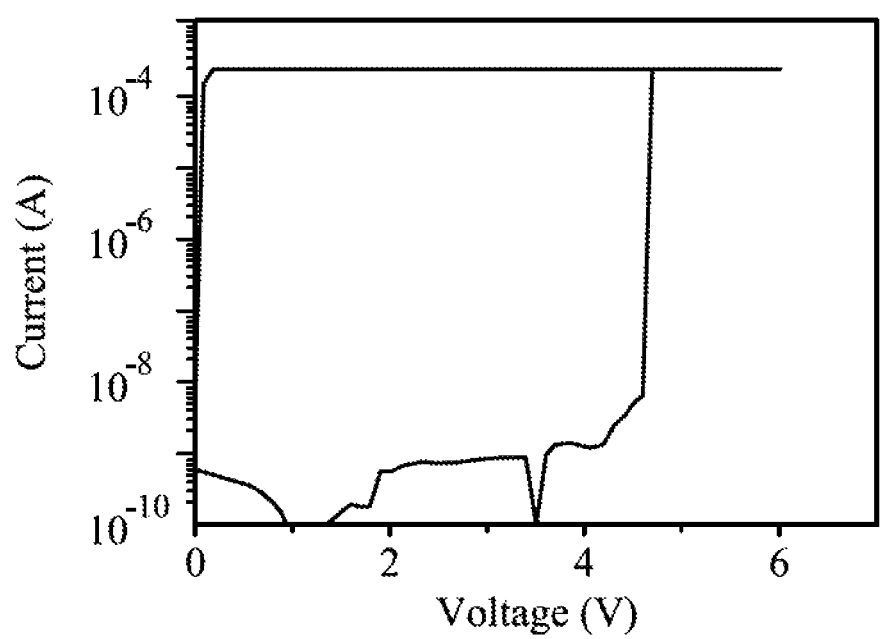

FIGS. 3A-3C show the experimental results of the forming voltages of the conductive-bridging random access memories in Comparative Example and Examples 1-2. The forming process of the low-electrical-resistance state of the conductive-bridging random access memory may be understood through FIGS. 3A-3C. The forming process was performed by applying a positive voltage to the top electrode layer (i.e., copper film) and the bottom electrode layer (i.e., titanium nitride film) is electrically grounded. During the formation process, the current increases as the applied voltage increases. When the current increases to the limit current value, the corresponding applied voltage value is defined as the forming voltage. When the applied voltage is greater than the forming voltage, the electrical resistance of the conductive-bridging random access memory is switched from the initial high-electrical-resistance state (HRS) to the low-electrical-resistance state (LRS). As shown in FIGS. 3A-3C, the forming voltage of Comparative Example, Example 1, and Example 2 is about 5.1 V, about 5.8 V, and about 4.7 V, respectively. Therefore, the forming voltage of the conductive-bridging random access memory may be increased if the high thermal-conductive material layer without high electrical conductivity is added. Accordingly, if the high thermal-conductive material layer without better electrical conductivity is selected, the influence of the high thermal-conductive material layer on the electrical conductivity of the whole device may be reduced or eliminated. As shown in FIG. 3C, when highly conductive tungsten is used as the high thermal-conductive material layer, the forming voltage can be prevented from increasing or even be made lower than the forming voltage of Comparative Example.

Figure 4A:
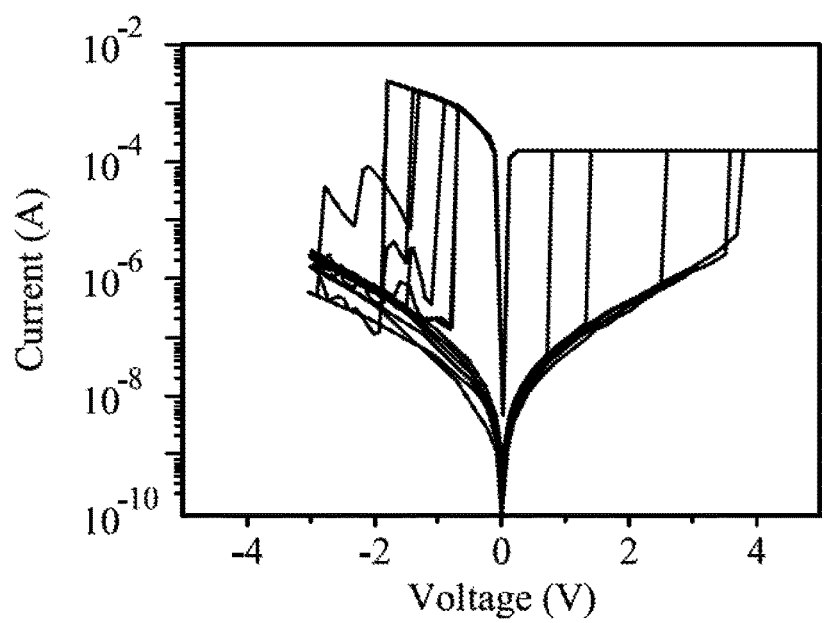
FIGS. 4A-4C show voltage-current curves of the electrical resistance state switching of the conductive-bridging random access memories in Comparative Example and Examples 1-2.
Figure 4B:
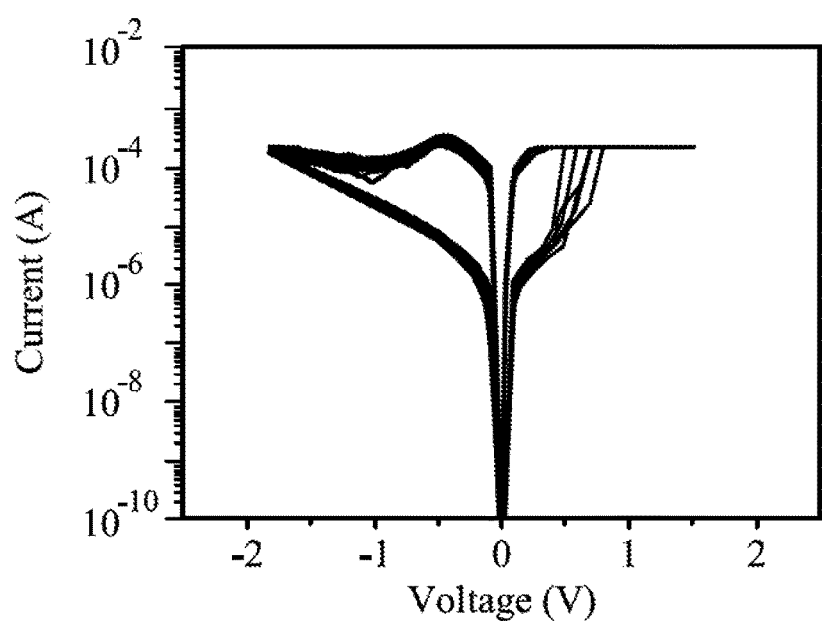
Figure 4C:
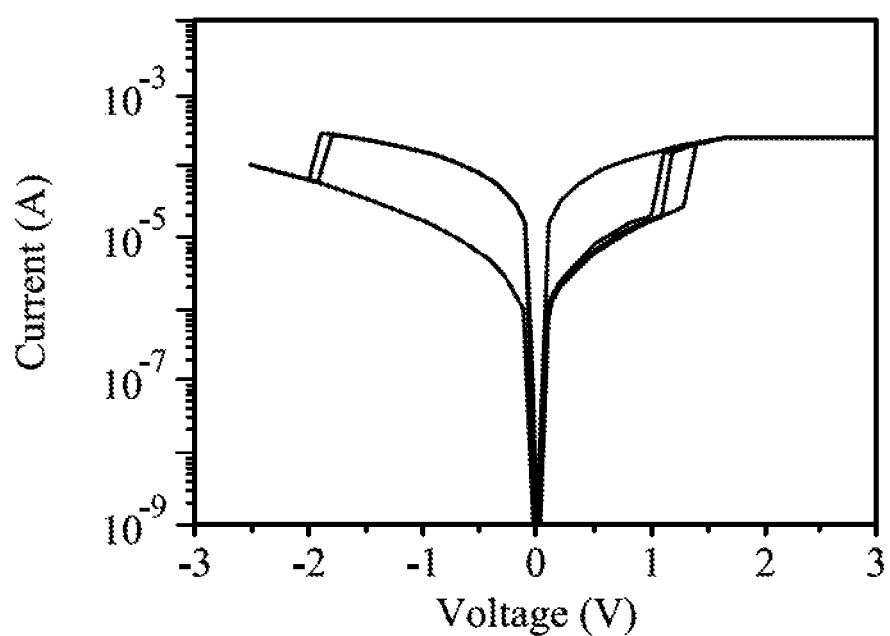

FIGS. 4A-4C show voltage-current curves of the electrical resistance state switching of the conductive-bridging random access memories in Comparative Example and Examples 1-2. The switching process between the high-electrical-resistance state and the low-electrical-resistance state of the conductive-bridging random access memory may be understood through FIGS. 4A-4C. The switching process was performed by applying a specific positive voltage to the top electrode layer (i.e., copper film), and the applied voltage was gradually increased from 0 V to the specific positive voltage. Then, the applied voltage was gradually decreased from the specific positive voltage to 0 V, and a cycle of switching process from the high-electrical-resistance state to the low-electrical-resistance state was completed. Next, a specific negative voltage was applied to the top electrode layer, and the applied voltage was gradually decreased from 0 V to the specific positive voltage. Then, the applied voltage was gradually increased from the specific negative voltage to 0 V, and a cycle of switching process from the low-electrical-resistance state to the high-electrical-resistance state was completed. In FIG. 4A, the specific positive voltage and the specific negative voltage used in the switching process was 5 V and −3 V, respectively. In FIG. 4B, the specific positive voltage and the specific negative voltage used in the switching process was 1.5 V and −1.8 V, respectively. In FIG. 4C, the specific positive voltage and the specific negative voltage used in the switching process was 3 V and −2.5 V, respectively. In addition, FIGS. 4A-4C showed the overlapped results of several cycles of the switching process.

Referring to FIG. 4A, voltage-current curves of the electrical resistance state switching of the conductive-bridging random access memory in Comparative Example did not overlap each other. This meant that the operating voltage ($V_{op\ c}$) of each cycle of the switching process were different from one another. In other words, the variability of the operating voltage was large. Referring to FIG. 4B, voltage-current curves of the electrical resistance state switching of the conductive-bridging random access memory in Example 1 were close to one another, and overlap. This meant that the operating voltages ($V_{op\ E1}$) of the cycles of the switching process were similar to or the same as one another. In other words, the variability of the operating voltage was small. Referring to FIG. 4C, the operating voltage ($V_{op\ E2}$) of the conductive-bridging random access memory of each cycle of the switching process in Example 2 were similar to or the same as one another. Accordingly, the variability of the operating voltage of the conductive-bridging random access memory was reduced by adding the high thermal-conductive material layer. In other words, the operating stability of the conductive-bridging random access memory was significantly improved.

Figure 5:
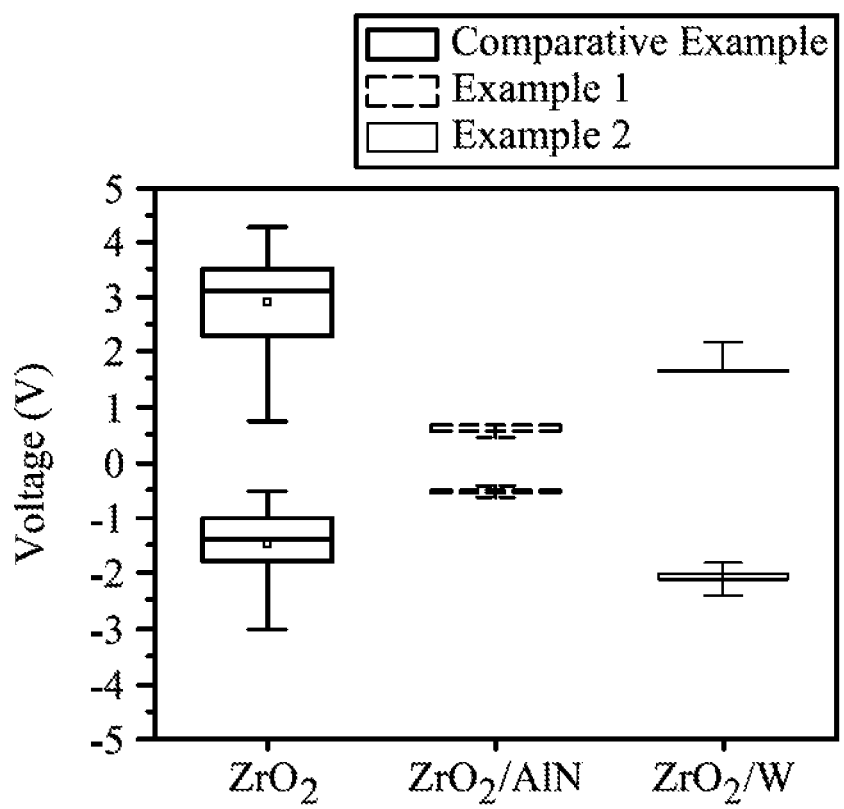
FIG. 5 shows the experimental results of the operating voltages of the conductive-bridging random access memories in Comparative Example and Examples 1-2.

FIG. 5 shows experimental results of the operating voltages of the conductive-bridging random access memories in Comparative Example and Examples 1-2. For the conductive-bridging random access memory in Comparative Example, the writing voltage was in a range of about 0.8 V to about 4.3 V, the average writing voltage was about 3 V, the erasing voltage was in a range of about −0.5 V to about −3 V, and the average erasing voltage was about −1.4 V. For the conductive-bridging random access memory in Example 1, the writing voltage was in a range of about 0.5 V to about 0.7 V, the average writing voltage was about 0.6 V, the erasing voltage was in a range of about −0.4 V to about −0.6 V, and the average erasing voltage was about −0.5 V. For the conductive-bridging random access memory in Example 2, the writing voltage was in a range of about 1.7 V to about 2.2 V, the average writing voltage was about 1.8 V, the erasing voltage was in a range of about −1.8 V to about −2.4 V, and the average erasing voltage was about −2.2 V. Accordingly, the writing voltage and the erasing voltage of the conductive-bridging random access memory were reduced by adding the high thermal-conductive material layer, and thus the performance of the device was improved.

Furthermore, the experimental results also proved that the variability of the operating voltage of the conductive-bridging random access memory was reduced by adding the high thermal-conductive material layer (i.e., the operating stability of the conductive-bridging random access memory could be significantly improved). According to the above experimental results, it may be deduced that the reason the operating voltage and variability thereof can be reduced is that the region (i.e., the specific high temperature region) where the metal filaments were formed or fractured was effectively controlled by the high thermal-conductive material layer.

Figure 6A:
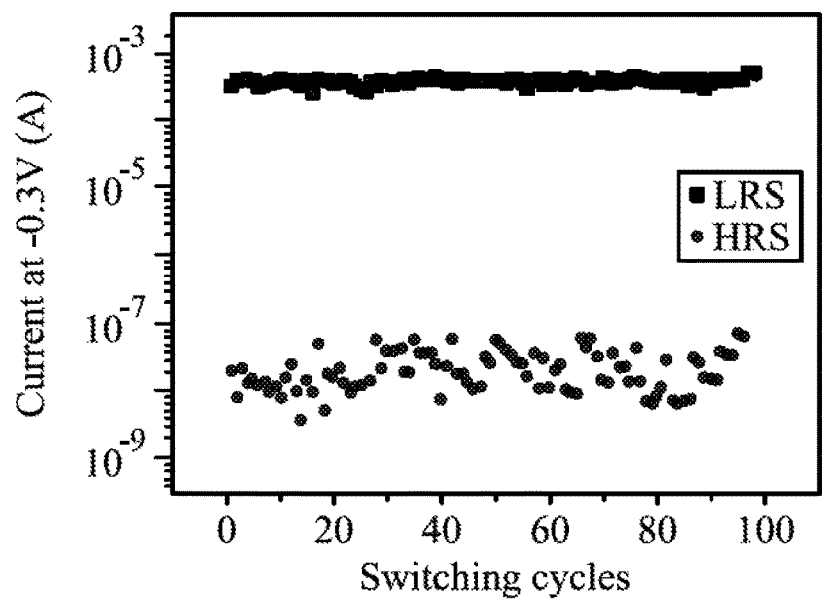
FIGS. 6A-6C show the experimental results of the endurance-test of the conductive-bridging random access memories in Comparative Example and Examples 1-2.
Figure 6B:
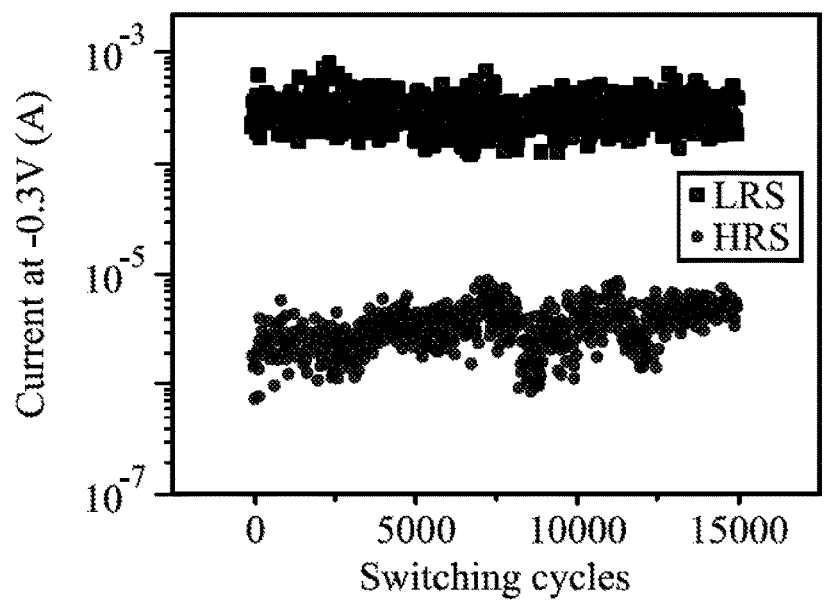
Figure 6C:
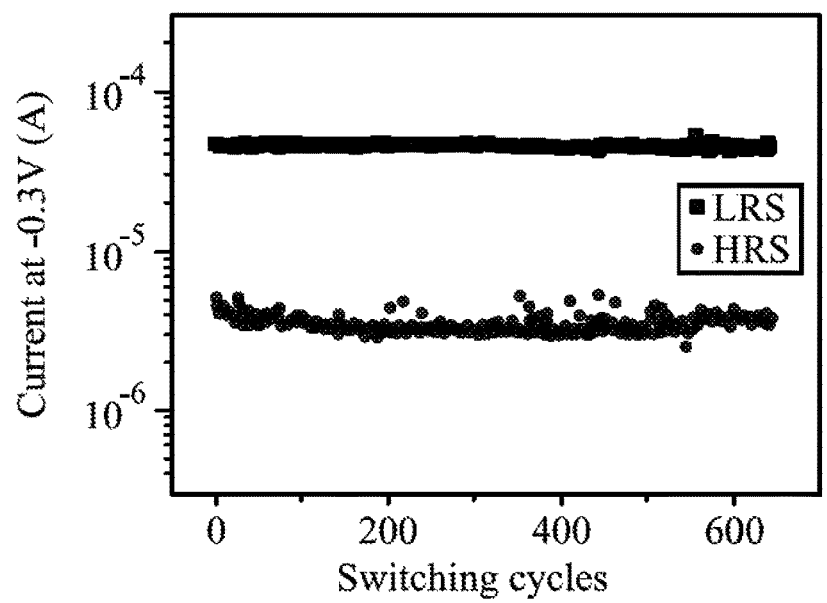

FIGS. 6A-6C show the experimental results of the endurance-test of the conductive-bridging random access memories in Comparative Example and Examples 1-2. Experimental conditions of FIGS. 6A-6C were respectively the same as those of FIGS. 4A-4C. The switching process was performed several cycles. During each cycle of the switching process, the current values at the high-electrical-resistance state and the low-electrical-resistance state were independently read out when the applied voltage was −0.3 V. Furthermore, the ratio of the electrical resistance value of the high-electrical-resistance state and the low-electrical-resistance state ($R_H/R_L$) was also calculated by the read current value.

The ratio of the electrical resistance value of the high-electrical-resistance state and the low-electrical-resistance state ($R_H/R_L$) in the same switching process cycle is maintained in a specific range. If the ratio of the electrical resistance value ($R_H/R_L$) is too low, an unexpected switching process may occur, and result in an operating error in the device. On the other hand, if the ratio of the electrical resistance value ($R_H/R_L$) is too high, the variability of the operating voltage ($V_{op}$) may be increased, and result in poor stability of the device. In some embodiments, the ratio of the electrical resistance value ($R_H/R_L$) is in a range of about 10-1000.

Referring to FIG. 6A, for the conductive-bridging random access memory in Comparative Example, the current values at the high-electrical-resistance state could not be read out after less than 100 cycles of the switching process. In other words, the conductive-bridging random access memory could not be switched from the low-electrical-resistance state to high-electrical-resistance state (i.e., the device failed) after less than 100 cycles of the switching process. Referring to FIG. 6B, for the conductive-bridging random access memory in Example 1, the ratio of the electrical resistance value ($R_H/R_L$) was greater than 10, even after greater than 15000 cycles of the switching process. Referring to FIG. 6C, for the conductive-bridging random access memory in Example 2, the ratio of the electrical resistance value ($R_H/R_L$) was greater than 10, even after more than 600 cycles of the switching process. Accordingly, the endurance of the conductive-bridging random access memory was significantly improved by adding the high thermal-conductive material layer.

Figure 7:
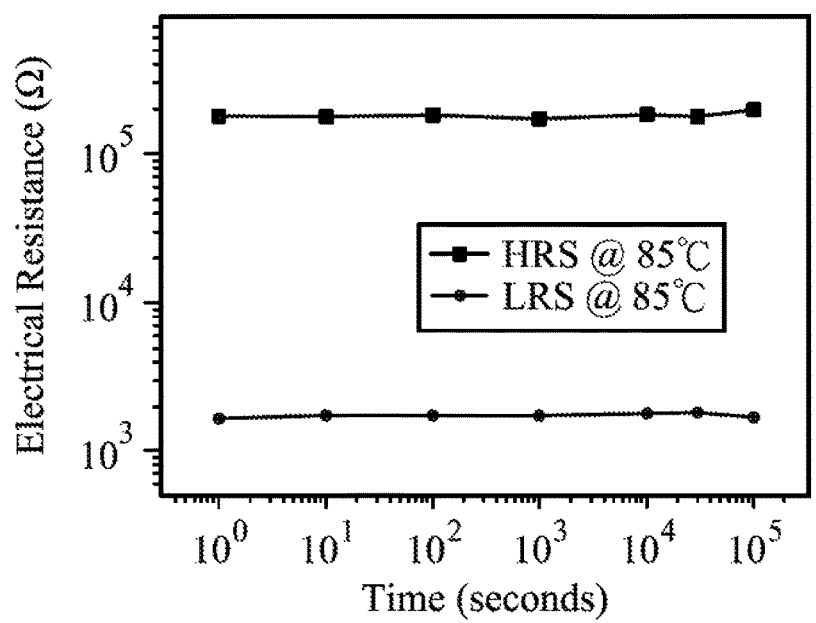
FIG. 7 shows the experimental results of high temperature data retention ability of the conductive-bridging random access memories in Example 1.

FIG. 7 shows the experimental results of high temperature data retention ability of the conductive-bridging random access memories in Example 1. This experiment was performed by placing the conductive-bridging random access memory at a temperature of 85° C. after it was switched from the high-electrical-resistance state to the low-electrical-resistance state. Then, the current values at the applied voltage being −0.3 V was read out at regular intervals, and the electrical resistance value of the low-electrical-resistance state was calculated by the read current value. Next, the conductive-bridging random access memory was switched from the low-electrical-resistance state to the high-electrical-resistance state, and then was placed at a temperature of 85° C. Then, the current values at the applied voltage being −0.3 V was read out at regular intervals, and the electrical resistance value of the high-electrical-resistance state was calculated by the read current value. As shown in FIG. 7, after being placed at a temperature of 85° C. for $10^5$ seconds, the conductive-bridging random access memory can read out the data correctly, and the memory property was not degraded. Furthermore, the ratio of the electrical resistance value ($R_H/R_L$) was greater than 100 after the conductive-bridging random access memory has been placed at a temperature of 85° C. for $10^5$ seconds.

For the conductive-bridging random access memory of this disclosure, the electrical resistance state switching region (i.e., the region in which the metal filaments are formed or fractured) can be well controlled in a specific region by adding the high thermal-conductive material layer, and therefore the stability and endurance of the device are significantly improved. Furthermore, the fabricating method of the conductive-bridging random access memory can be easily incorporated to existing fabricating processes of the conductive-bridging random access memory without additionally replacing or modifying the production equipment. Therefore, the stability and endurance of the device can be significantly improved without increasing the process complexity and manufacture cost. It is advantageous for improving both the performance stability and the product lifetime of the conductive-bridging random access memory.

Although the disclosure has been described by way of example and in terms of the preferred embodiments, it should be understood that various modifications and similar arrangements (as would be apparent to those skilled in the art) can be made herein without departing from the spirit and scope of the disclosure as defined by the appended claims.

What is claimed is:

1. A conductive-bridging random access memory, comprising:
   a semiconductor substrate;
   a bottom electrode layer formed on the semiconductor substrate;
   an electrical resistance switching layer formed on the bottom electrode layer, wherein the electrical resistance switching layer comprises oxides, nitrides, or combinations thereof;
   a barrier layer formed on the electrical resistance switching layer;
   a top electrode layer formed on the barrier layer; and
   a high thermal-conductive material layer formed between the bottom electrode layer and the electrical resistance switching layer, wherein the high thermal-conductive material layer has a thermal conductivity in a range of 70-5000 W/mK.

2. The conductive-bridging random access memory as claimed in claim 1, wherein the high thermal-conductive material layer comprises nitride, oxide, carbide, metal, alloy, or combinations thereof.

3. The conductive-bridging random access memory as claimed in claim 2, wherein the high thermal-conductive material layer comprises aluminium nitride, beryllium oxide, gold, platinum, nickel, tungsten, iron, zinc, graphite, carbon nanotubes or combinations thereof.

4. The conductive-bridging random access memory as claimed in claim 1, wherein the high thermal-conductive material layer has a thickness in a range of 1-1000 nm.

5. The conductive-bridging random access memory as claimed in claim 1, wherein a thermal conductivity of the electrical resistance switching layer is lower than that of the high thermal-conductive material layer.

6. The conductive-bridging random access memory as claimed in claim 1, wherein the high thermal-conductive material layer has an electrical conductivity in a range of $9\times10^6$-$1\times10^8$ S/m.

7. The conductive-bridging random access memory as claimed in claim 1, wherein the high thermal-conductive material layer has an electrical conductivity in a range of $5\times10^{-15}$-$5\times10^{-14}$ S/m.

8. The conductive-bridging random access memory as claimed in claim 1, wherein a difference between a coefficient of linear thermal expansion of the high thermal-conductive material layer and a coefficient of linear thermal expansion of the electrical resistance switching layer is equal to or lower than $50\times10^{-6}$ 1/K.

9. The conductive-bridging random access memory as claimed in claim 1, wherein the top electrode layer comprises a metal and an alloy, and wherein the metal and the alloy comprise copper, gold, silver, or tellurium.

\* \* \* \* \*